(12) United States Patent
Mao et al.

(10) Patent No.: US 7,164,197 B2
(45) Date of Patent: Jan. 16, 2007

(54) DIELECTRIC COMPOSITE MATERIAL

(75) Inventors: Guoping Mao, Woodbury, MN (US);
Shichun Qu, Eau Claire, WI (US);
Fuming B. Li, Woodbury, MN (US);
Robert S. Clough, St. Paul, MN (US);
Nelson B. O'Bryan, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 134 days.

(21) Appl. No.: 10/465,155

(22) Filed: Jun. 19, 2003

(65) Prior Publication Data

US 2004/0256731 A1    Dec. 23, 2004

(51) Int. Cl.
*H01L 29/51*    (2006.01)
*H01L 23/532*    (2006.01)

(52) U.S. Cl. .............. 257/700; 257/702; 257/759; 257/760; 257/762

(58) Field of Classification Search .......... 257/759, 257/760, 762, 795, 789, E23.107, E23.136, 257/E23.161, 700, 701, 702
See application file for complete search history.

(56) References Cited

U.S. PATENT DOCUMENTS

| | | | |
|---|---|---|---|
| 5,126,192 A * | 6/1992 | Chellis et al. ............. 428/323 |
| 5,378,927 A | 1/1995 | McAllister et al. | |
| 5,492,552 A | 2/1996 | Cronk et al. | |
| 5,844,170 A | 12/1998 | Chor et al. | |
| 5,946,600 A | 8/1999 | Hurwitz et al. | |
| 6,021,564 A * | 2/2000 | Hanson ............. 29/852 |
| 6,091,466 A | 7/2000 | Kim et al. | |
| 6,143,401 A * | 11/2000 | Fischer et al. ........... 428/322.7 |
| 6,184,284 B1 * | 2/2001 | Stokich et al. ............ 524/500 |
| 6,262,376 B1 | 7/2001 | Hurwitz et al. | |
| 6,262,478 B1 | 7/2001 | Hurwitz et al. | |
| 6,280,640 B1 | 8/2001 | Hurwitz et al. | |
| 6,288,188 B1 | 9/2001 | Godschalx et al. | |
| 6,310,368 B1 | 10/2001 | Yagura | |
| 6,346,296 B1 * | 2/2002 | McCarthy et al. ............ 442/66 |
| 6,361,926 B1 | 3/2002 | So et al. | |
| 6,388,890 B1 | 5/2002 | Kwong et al. | |
| 6,410,414 B1 | 6/2002 | Lee | |
| 6,420,093 B1 | 7/2002 | Ohba et al. | |
| 6,455,880 B1 | 9/2002 | Ono et al. | |
| 6,528,145 B1 * | 3/2003 | Berger et al. ............. 428/156 |
| 6,544,638 B1 * | 4/2003 | Fischer et al. ........... 428/322.7 |
| 2002/0102494 A1 | 8/2002 | Ohba et al. | |
| 2003/0069349 A1 | 4/2003 | Sumita et al. | |

(Continued)

FOREIGN PATENT DOCUMENTS

EP         0 616 701 B1    2/2002

(Continued)

OTHER PUBLICATIONS

Phil Garrou, et al., "*High Frequency/High Density Build-up Boards with Benzocyclobutene (BCB) Polymer Coated Cu Foil*", 2000 IEEE, 2000 Electronic Components and Technology Conference, pp. 1647-1651.

(Continued)

*Primary Examiner*—M. Wilczewski
(74) *Attorney, Agent, or Firm*—Melanie G. Gover (57) ABSTRACT

A dielectric composite material containing a toughened benzocyclobutene resin and at least about 50% by weight of an inorganic filler. Also electronic packages having at least one conductive layer and at least one layer of the dielectric composite material. The dielectric composite material can have a dielectric constant less than about 3.5, and a dielectric loss of less than about 0.004.

7 Claims, 2 Drawing Sheets

U.S. PATENT DOCUMENTS

2004/0148766 A1* 8/2004 Noguchi et al. .............. 29/830

FOREIGN PATENT DOCUMENTS

| WO | WO 90/06960 | 6/1990 |
| WO | WO 96/31805 | 10/1996 |
| WO | WO 01/58230 A1 | 8/2001 |
| WO | WO 02/16477 A2 | 2/2002 |

OTHER PUBLICATIONS

Ying-Hung So, et al., "*Benzocyclobutene (BCB) Based Polymers for Microelectronic Applications*", Abstracts of Papers of the American Chemical Society, 2002, vol. 224, 2, Aug. 18, 2002, p. U496, 14 pages.

Tadanori Shimoto, et al., "*High Density Multilayer Substrate Using Benzocyclobutene Dielectric*", IMC 1992 Proceedings, Yokohama, Japan, Jun. 3-Jun. 5, 1992, pp. 325-330.

Jeffrey M. Snodgrass, et al., "*The effect of Fatigue on the Adhesion and Subcritical Debonding of Benzocyclobutene/Silicon Dioxide Interfaces*", Material Research Society Symposium Proceedings, vol. 612 © 2000 Materials Research Society, pp. D1.3.1-D.1.3.6.

N. Yasmeen et al., "Benzocyclobutene/Copper Reliability Study", Electrochemical Society Proceedings vol. 98-3, pp. 299-312.

P. Pieters et al., "High-Q Inductors for Realization of Low Insertion Loss Baluns and Couplers Integrated in Thin Film Multilayer MCM-D Technology for Wireless Applications", 30th European Microwave Conference—Paris 2000, pp. 60-63.

X. Sun et al., "Analysis of High-Q On-Chip Inductors Realized by Wafer-Level Packaging Techniques", 2003 Electronic Components and Technology Conference, pp. 1510-1515.

Maura Jenkins et al., "Studies of Silane Adhesion Promoters on Silica Filler Particles for use in Microelectronic Packaging", Mat. Res. Soc. Symp. Proc. vol. 710, copyright 2002 Materials Research Society, pp. DD10.10.1-DD10.10.6.

Percy B. Chinoy et al., "Processing and Microwave Characterization of Multilevel Interconnects Using Benzocyclobutene Dielectric", IEEE Transactions on Components, Hybrids and Manufacturing Technology, Nov. 16, 1993, No. 7, New York, US, pp. 714-719.

* cited by examiner

DIELECTRIC COMPOSITE MATERIAL

FIELD

The present invention relates to dielectric composite materials suitable for use in electronic packages and electronic packages made with such dielectric materials.

BACKGROUND

Only a few dielectric materials are useful for high performance electronic applications. To be useful for high speed interconnects, a material must have a low dielectric constant, low loss, and must be capable of adhering to the other materials that it may interface, such as copper, chrome, zinc, aluminum, silicon oxide, silicon nitride (SiN), titanium nitride (TiN), plasma enhanced oxide (PEOX), phosphorsilicate glass (PSG), and the like. Also, the materials must be processable using typical manufacturing techniques, such as spin-on coating, die coating, chemical mechanical polishing, dry etch, imaging, laser ablation, hot/cold press, etc. Other desirable material properties include low moisture absorption, outstanding chemical resistance, good thermal properties, predictable dimension movement, controllable melt flow viscosity, and fracture resistance to cyclic stress.

Advanced high density, multilayer electronic packages require advanced dielectric materials, especially in the high frequency (GHz) applications. One of the key properties for such advanced dielectrics is the low dielectric loss in the GHz frequency range, where associated signal loss becomes a key performance roadblock. To have low dielectric loss, the dielectric materials must have low polarity as well as low dipole moment. Another key requirement is that the glass transition temperature ($T_g$) of the dielectric materials must be sufficiently high, e.g., higher than 200° C., to survive increasing high temperature manufacturing processes, such as lead-free solder reflow. Other requirements include excellent gap-fill properties, toughness (good elongation), low coefficient of thermal expansion (CTE), e.g., a CTE close to that of copper, (CTE of 17 parts per million (ppm)/° C.), and good adhesion to different bonding treatments applied to other layers.

A dielectric material frequently used for high frequency microwave (e.g., 2.4 GHz) applications is one of a variety of composites based on a fluoropolymer material sold under the trade name TEFLON, such as TEFLON/ceramic, TEFLON/fiberglass, etc. However, TEFLON materials require a high lamination temperature, i.e., over 350° C. Also, due to the non-crosslinked nature (thermoplastic) of TEFLON materials, dimensional stability issues arise when an outside layer is laminated to previous layers. Polyimides, and some polyesters (e.g., aromatic liquid crystal polymers) are also dielectric with good electrical properties, but these polymer-based dielectric materials have issues with moisture uptake, flow-fill, or high CTEs (greater than 60 ppm/° C., especially in Z-axis), which again limit the materials to certain applications. Benzocyclobutene (BCB) polymers are now also becoming known as useful dielectric compounds.

U.S. Pat. No. 6,514,872 B1 discloses a method for manufacturing a semiconductor device in which a benzocyclobutene serves as an inter layer dielectric (ILD). The BCB coating, in a thickness range from 5 μm to 8 μm, is spin-coated onto the desired surface and then patterned anisotropically with a mixture of $Cl_2/BCl_3/O_2$ using $SiO_2$ film as an etch mask.

U.S. Pat. No. 6,410,414 B1 discloses a method for fabricating a semiconductor device in which a benzocyclobutene film serves as an insulator between redistribution wiring and an alpha particles blocking layer between sensitive integrated circuit devices, such as a memory cell, and an alpha particle source such as a solder ball. The BCB coating, having a thickness range from 10 μm to 100 μm, is spin-coated onto the desired surface.

U.S. Pat. No. 6,294,741 B1 discloses a multi chip module (MCM) package using benzocyclobutene polymer as a laminate adhesive in the construction of such structure. The BCB polymer is first spin-coated onto frame polyimide film sold under the trade name KAPTON E in a layer thickness from 5 μm to 15 μm, and then baked and laminated for making multi-layer interconnect structure.

U.S. Pat. No. 6,262,376 discloses a process for building up high frequency chip carrier substrate on a printed wiring board (PWB) or multi-layer ceramic (MLC) base, in which a polyimide film, or benzocyclobutene film, or a thermoplastic film, with dielectric constant less than 3.0, serves as an insulator on the upper conductor layer(s). The process deposits the dielectric film using either spin-on coating, or chemical vapor deposition (CVD).

U.S. Pat. No. 6,420,093 discloses a process for buildingup printed wiring boards on thick printed circuit board (PCB) cores using metal foil coated with toughened benzocyclobutene-based dielectric polymers. The process laminates a sheet with a metal foil and a BCB-containing dielectric material. The BCB polymers disclosed comprise ethylenically unsaturated polymer additives and photoactive compounds. A partially polymerized "b-stage" material is also disclosed. However, use of fillers is not disclosed. Due to the non-polar nature of the BCB materials and the non-polar solvents, such as mesitylene, used in BCB systems, the polymers are not normally compatible with inorganic filler particles such as silica.

To date, most of the applications involving BCB material use spin-on coating of the materials, either dry etchable or photo imageable, which contain no fillers. Coating thickness is typically less than 20 μm due to the relatively high curing stress of BCB, which often causes wafer or substrate bowing, and thus makes the wafer/substrate unprocessable in post coating processes.

SUMMARY

It has now been discovered that a toughened BCB resin may be formed into a highly filled composite material with excellent dielectrical, thermal, and mechanical properties. Such a composite BCB material may be coated directly onto copper or other substrates for use in electronic packages. It has also been discovered that a compatiblized highly filled BCB resin will retain excellent dielectric properties and will also adhere strongly to low profile copper surfaces and other surfaces of interest.

One aspect of the present invention is a dielectric composite material useful in electronic packages having a dielectric constant less than about 3.5, and a dielectric loss of less than about 0.004, the composite material including a toughened benzocyclobutene resin, and from about 50% to about 75% by weight of at least one particulate inorganic filler; the resin and the filler being compatiblized by means of a compatibilizing agent. The dielectric composite material may have a CTE of less than about 50 ppm/° C. and/or tensile elongation of about 2%. A coating of the dielectric composite material may have a thickness of from about 0.5 μm to about 100 μm, preferably about 0.5 μm to about 50 μm, and a peel strength to low profile copper of at least about 2 lbs/in (0.35 N/mm).

Another aspect of the invention is an electronic package having at least one conductive layer, and at least one layer of dielectric composite material laminated thereto, wherein the dielectric composite material has a dielectric constant less than about 3.5, and a dielectric loss of less than about 0.004, wherein the dielectric composite material includes a toughened benzocyclobutene resin, and from about 50% to about 75% by weight of at least one inorganic particulate filler; the resin and the filler being compatiblized by means of a silane coupling agent. In one embodiment of the electronic package, the inorganic particulate filler comprises silica particles.

Another aspect of the invention is a dispersion comprising a toughened benzocyclobutene resin, at least one inorganic particulate filler having a dielectric constant of less than or equal to 4.0, and a dielectric loss of less than 0.001; a silane coupling agent; and a non-polar solvent.

Another aspect of the invention provides a substrate structure comprising a conductive layer coated with at least one layer of dielectric composite material having a dielectric constant less than about 3.5, a dielectric loss of less than about 0.004, wherein the dielectric composite material includes a toughened benzocyclobutene resin, and from about 50% to about 75% by weight of at least one inorganic particulate filler; the resin and the filler being compatiblized by means of a silane coupling agent.

As used herein, all weights, ratios and amounts are by weight unless otherwise specified.

As used herein, the following terms have these meanings:

1. The term "compatiblized" means rendered compatible with one another through the use of an additional agent, which is compatible with each of the otherwise incompatible materials.

2. The term "CTE" refers to the coefficient of thermal expansion of a material. The term "low CTE" means having an isotropic CTE of less than 40 ppm/° C. up to a temperature of about 200° C.

3. The term "low profile" means having a surface roughness, with a maximum foil profile variation ($R_z$) of less than about 10.2 μm (about 200 microinches).

4. The term "B-stage" means a partially polymerized material, which must undergo further curing to reach the final desired state.

5. The term "dielectric composite material" refers to a material that includes both a toughened benzocyclobutene resin and an additional inorganic filler. The BCB resin includes tougheners prior to forming the composite material.

6. The term "toughened BCB" refers to BCB material containing a rubber phase in the form of discrete particles embedded in the BCB material matrix.

7. The term "highly filled" refers to loading of the toughened BCB matrix with an inorganic filler at levels greater than or equal to about 50 wt. %.

8. The terms "coating" and "layer" are used interchangeably herein.

DETAILED DESCRIPTION OF THE INVENTION

The dielectric composite material of the present invention is a highly filled, toughened benzocyclobutene (BCB) resin. BCB resins are commercially available from Dow Chemical under the trade name CYCLOTENE. BCB polymers have excellent dielectric properties, both dielectric constant and loss, well into the upper frequency range (1–40 GHz), even in high humidity operating conditions. One embodiment of the formula described herein uses a prepolymerized, or "b-staged" divinylsiloxane bis-benzocyclobutene, which is commercially available from Dow Chemical Company.

To provide advanced dielectrics for multilayer electronic packaging application and to meet all the requirements desirable for advanced dielectric materials, highly filled dielectric polymer composite materials are formed based on toughened benzocyclobutene (BCB) and inorganic filler particles. Toughened BCB materials exhibit much improved mechanical properties, with elongation up to about 35% without macroscopic phase separation. Toughened BCB resins exhibit excellent dielectric properties, having a dielectric loss of less than 0.0025 and a low dielectric constant of about 2.6. The resins also have excellent flow-fill properties. The $T_g$ is high, above 300° C. However, BCB resins, especially the toughened BCB resins, have a CTE in excess of 85 ppm/° C. This high CTE limits their usefulness in high-density semiconductor packages. The exact CTE is dependent on the amount of toughening agent used in the formula.

To reduce the CTE of the toughened resin and still maintain its excellent electrical-mechanical performance and chemical resistance, inorganic fillers are added to form a dielectric composite material. In general, useful fillers for composite material compositions of the invention include inorganic fillers having dielectric constants of less than 5 and dielectric loss (in GHz range) of less than 0.002. Essentially, any particulate filler with these properties is useful, as long as it is less than about 2 microns average size or about 8 microns absolute size, and has good insulative properties, and/or good dielectric properties. The filler preferably has an average particle size of less than or equal to ten percent of the layer thickness of the dielectric composite material in the final product. The filler also preferably has a dielectric constant of less than or equal to 4.0, and a dielectric loss of less than 0.001. One such filler is silica ($SiO_2$). Other suitable inorganic fillers include, but are not limited to, alumina, quartz, and glass.

Optionally, the initial BCB resin or the dielectric composite material may contain stabilizers that inhibit or retard heat degradation, oxidation, and skin or color formation during processing steps that expose the material to high temperatures.

At least one embodiment of the composite dielectric material of the present invention has one or more of the following desirable traits. First, the inorganic filler, e.g., silica, forms a stable dispersion with toughened BCB. Second, there is good adhesion between the inorganic fillers and the BCB polymer. Third, adhesion between the dielectric composite material (e.g., BCB-$SiO_2$) and surfaces of interest (e.g., copper or other metal foils, another layer of the BCB-$SiO_2$ material, etc.) can be improved by use of a surface priming solution. In particular, good adhesion to low profile thin copper (having a thickness of up to about 5 μm) is desirable. Finally, the dielectric composite material is capable of being coated in uniformly thin layers onto a chosen substrate to achieve good electrical performance.

Typically the dielectric composite material is made by forming a dispersion comprising a toughened benzocyclobutene resin, at least one inorganic particulate filler; a coupling agent; and a non-polar solvent.

To make inorganic particulate fillers, such as silica, compatible with a non-polar solvent such as mesitylene, toluene, or mixtures thereof, the silica surface may be treated, e.g., functionalized. One method of functionalizing the surface that will also rendering the fillers compatible with BCB resins is to use silane coupling agents such as vinyltriethoxysilane (VTS), vinyltriacetoxysilane (VTAS), 7-octenyltrimethoxysilane, aminopropylsilane (APS), and mixtures thereof. When a mixture is used, it can also include additional silanes such as octyltrimethoxysilane, hexyltrimethoxysilane, pentyltrimethoxysilane, phenyltrimethoxysilane, and mixtures thereof. If the silica is not surface treated, it tends to agglomerate in the non-polar solvents.

Other methods of compatiblizing the inorganic filler with BCB resins and/or non-polar solvents include use of dispersing agents or surfactants that will not significantly decrease the performances of the finished dielectric film.

Other additives may be used in the dielectric composite material, provided that they do not interfere with the adhesion properties or the dielectric properties of the composite material. Useful additives include antioxidants, stabilizers, dyes, colorants, and the like.

Substrates and electronic packages of the present invention include at least one conductive layer, and typically include multiple conductive layers with multiple interleaved dielectric layers. At least one of the dielectric layers or the core layer comprises the dielectric composite material of the present invention. The conductive layer may comprise any suitable type of conductive material. Examples of suitable materials included laminated low profile copper, plated copper, and sputtered aluminum. The conductive layer is typically less than about 40 µm thick, preferably 18 µm. In one embodiment the conductive layer(s) are formed from copper. Copper substrates are preferably thin, typically 5 µm or less, with low profile surfaces. Due to its non-polar nature, BCB has poor adhesion to copper substrates. To improve the adhesion between copper and BCB dielectric composite material, primers or coupling agents may be used to prime the copper surface prior to coating of the BCB dielectric composite material. Useful primers include vinyltriacetoxysilane, aminosilane, aminopropylsilane, and the like. When used, the primer is typically placed onto the copper substrate, which is then baked at 100° C. or more for a period of about 5 to about 10 minutes prior to coating of the dielectric composite material.

To precision coat the dielectric composite material, a solvent-containing dispersion of the dielectric composite material is coated onto the desired substrate and dried, preferably at elevated temperatures in order to remove the solvent. The dried coatings preferably have a thickness of between about 0.5 micrometer and about 100 micrometers. In one preferred embodiment, the dielectric layer has a thickness of 25 µm or less. A thickness of 36 µm and even 40 µm may be useful for some applications. Curing the dielectric composite material can be completed through baking or lamination. The lamination temperature will vary with the specific ingredients used. Alternatively, the dispersion may be coated onto a release liner such as poly(ethylene terephthalate) and then laminated to the thin copper substrates. Completed substrate structures may comprise a single conductive layer with a dielectric composite material coated as described or multiple layers of conductive and/or dielectric composite material.

Another aspect of the present invention is a multilayer electronic package having multiple conductive layers, at least one of which is a copper layer, and multiple dielectric layers, at least one of which comprises a dielectric composite material having a dielectric constant less than about 3.5, and a dielectric loss of less than about 0.004, wherein the dielectric composite material includes a toughened benzocyclobutene resin with about 50% to about 75% by weight of a particulate silica filler, the resin and the filler being compatiblized by means of a compatibilizing agent such as a dispersant, a surfactant or a silane coupling agent.

Figure 1:
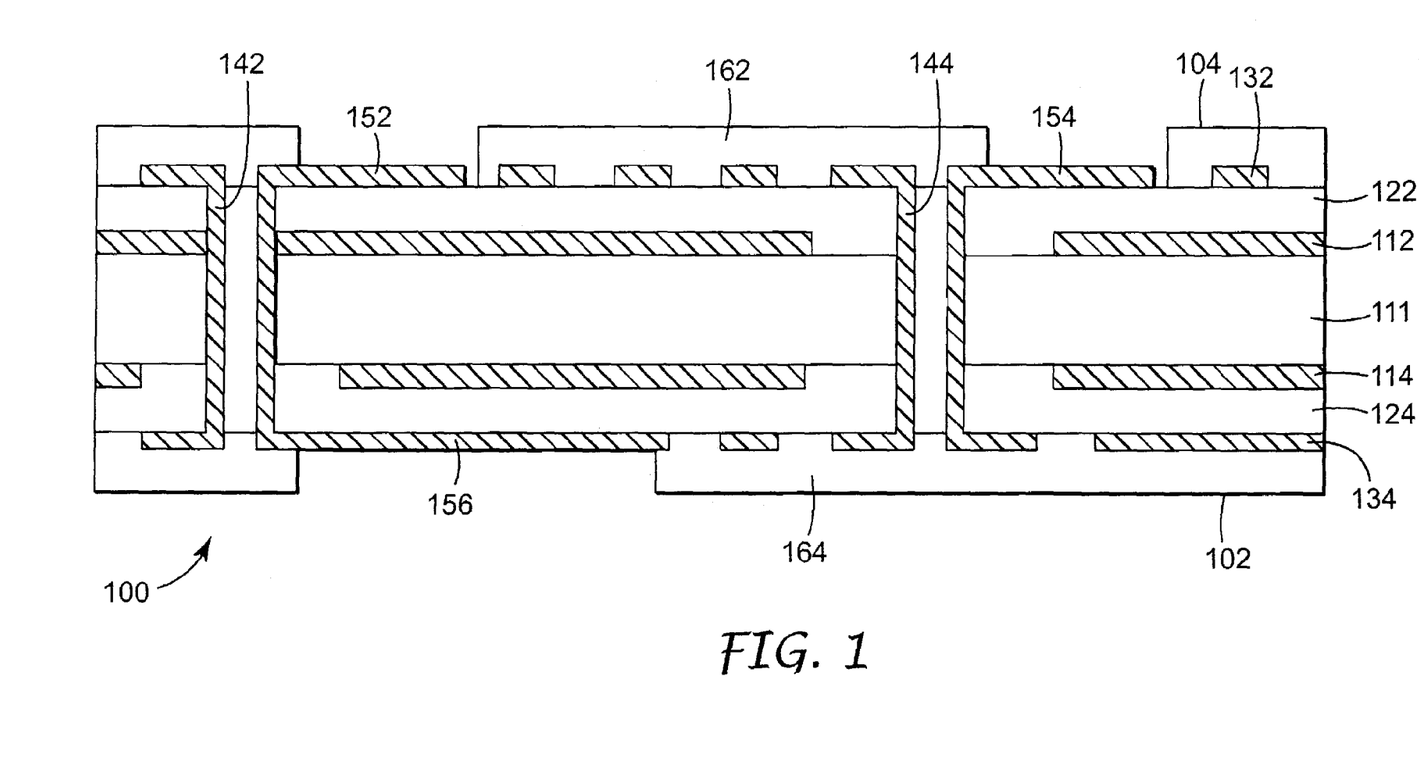
FIG. 1 is a schematic representation of a multilayer interconnect substrate.
Figure 2:
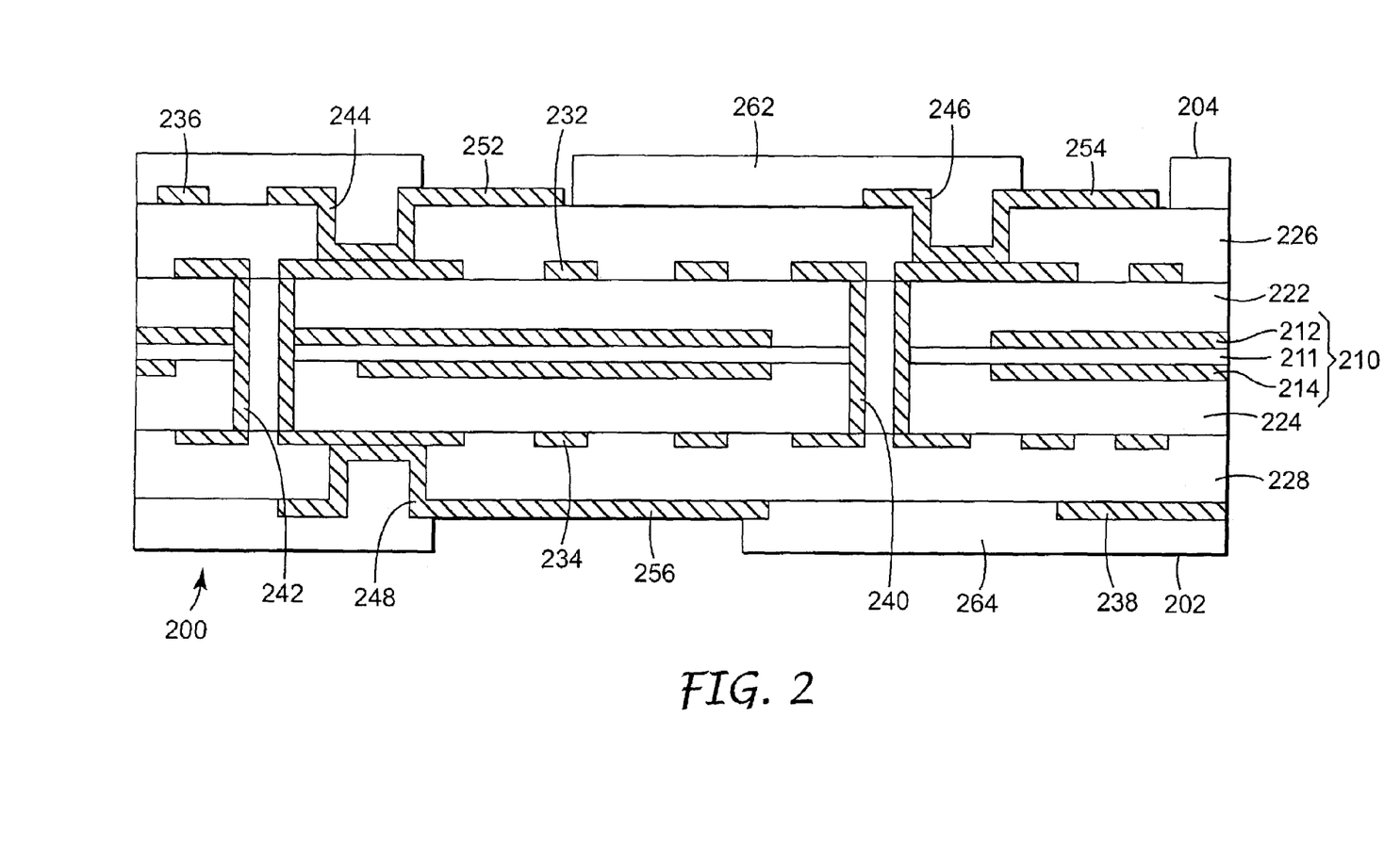
FIG. 2 is a cross-sectional view of a multilayer interconnect substrate with a die attach surface and a board attach surface.

FIGS. 1 and 2 are exemplary embodiments of multilayer IC packages that can be made with the composite dielectric material of the current invention that are useful for packaging integrated circuit dies. Multiple dielectric layers can be formed from the BCB composite dielectric material.

FIG. 1 is a schematic representation of one possible multilayer interconnect substrate that could be produced with the dielectric material of the current invention. FIG. 1 shows 4-metal layer interconnect substrate 100 made by laminating an alternating series of conductive (typically metal) layers 112, 114, 132 and 134; core layer 111; and dielectric layers 122 and 124. The conductive and dielectric layers shown in FIG. 1 are disposed symmetrically about core layer 111. By "disposed symmetrically", it is meant that each dielectric or conductive layer formed on one side of core layer 111 has a corresponding layer of the same material formed on the opposite side of the core layer.

As further shown in FIG. 1, via 142 or 144 is used to interconnect the various metal layers. Via 142 extends through each of core layer 111 and dielectric layers 122, and 124 from conductive layer 132 and terminates at conductive layer 134. Each via 142, 144 is plated with conductive material using any of the deposition techniques that are known in the microelectronic fabrication art. In an alternative embodiment, each via 142, 144 may be filled with an electrically conductive material to define a conductive path. One skilled in the art will recognize that any combination of vias (through vias, blind vias and buried vias) may be used to provide electrical connections between the bond pads 152, 154 on die attach surface 104 and bond pad 156 on the ball grid array (BGA) attach surface 102.

Solder masks 162, 164 can be applied to die attach surface 104 and BGA attach surface 102. Each solder mask 162, 164 exposes a contact or bond pad adjacent to each via 142, 144. For example, solder mask 162 exposes contact pads 152, 154, whereas solder mask 164 exposes contact pads 156. Solder balls (not shown) associated with the chip can be aligned over contact pads, 152, 154, then heated, and reflowed to form an electrical and mechanical bond to the contact pads of the multilayer substrate and the chip. Likewise, solder balls (not shown) associated with the printed wiring board (PWB) can be aligned over contact pads 156, heated, and reflowed to form an electrical and mechanical bond between the contact pads and the PWB.

Core layer 111 may be conductive, non-conductive, or may include a combination of conductive and non-conductive materials. Suitable conductive materials include thick copper (e.g., up to ½ mm). Suitable non-conductive materials include the composite dielectric material of the invention, polyimide, glass, ceramics, inorganic dielectric materials, polymer/dielectric material blends, and the like. Suitable combination materials include flexible electrical circuits, capacitors, and printed wiring boards.

Dielectric layers 122 and 124 may be formed from individual layers of, or laminates of a combination of, high-temperature organic dielectric substrate materials, such as polyimides and polyimide laminates, epoxy resins, liquid crystal polymers (LCP), a dielectric composite material of the current invention, or dielectric materials comprised at least in part of polytetrafluoroethylene, with or without a filler. In one exemplary package design having a core layer and two dielectric layers, the non-conductive core layer may be composed of either a liquid crystal such as BIAC film (Japan Gore-Tex Inc., Okayama-Ken, Japan) or LCP CT film (Kuraray Co., Ltd., Okyama, Japan) or a polyimide film such as KAPTON H, K, or E (E. I. Du Pont de Nemours and Company) or a polyimide film sold under the trade name UPILEX (Ube Industries, Ltd.,) and the other two dielectric layers are composed of a dielectric composite material of the current invention.

Conductive layers 112, 114, 132 and 134 may be formed from known conductive materials, such as copper. Other well-known conductive materials that may also be used include aluminum, gold, nickel, or silver. In at least one embodiment, conductive layers 112, 114, 132 and 134 may each have a thickness in the range of from about 5 to about 14 microns. In one exemplary package design, the thickness of each conductive layer 112, 114, 132 and 134, is approximately 12 microns. Core layer 111 may have a thickness in the range of at least about 1 micron to 750 microns. The remaining dielectric layers 122, 124 may each have a thickness in the range of about 20 to about 70 microns. In one example, the thickness of each dielectric layer 122, 124 is approximately 36 microns.

The various layers of interconnect substrate 100 can be stacked together and laminated using heat and pressure. For example, all of the layers can be simultaneously laminated with each other in a stack. Alternatively, the layers can be built upon a core layer 111 one at a time, or incrementally built with one or two additional layers added in each lamination step. During lamination, dielectric layers 122 and 124 melt and flow to provide a monolithic bulk dielectric material. The conductive layers can be patterned using standard known photolithography and etch methods.

Through vias can be formed following lamination of interconnect substrate 100. In particular, vias may be formed by drilling or laser ablation processes as described in U.S. Pat. No. 6,021,564, column 10, line 31 to column 31, line 10, incorporated herein by reference, or by chemical milling processes. Following lamination, solder masks 162 and 164 are added to interconnect substrate 100. Solder masks 162 and 164 may be patterned to define contact pads 152, 154 and 156 for receipt of solder balls from a chip and PWB, respectively.

In some embodiments (not shown in FIG. 1), interconnect substrate 100 may accept a "flip-chip" integrated circuit. Flip-chip mounting entails placing solder balls on a die or chip, flipping the chip over, aligning the chip with the contact pads on a substrate, such as interconnect module 100, and reflowing the solder balls in a furnace to establish bonding between the chip and the substrate. In this manner, the contact pads are distributed over the entire chip surface rather than being confined to the periphery as in wire bonding and tape-automated bonding (TAB) techniques. As a result, the maximum number of I/O and power/ground terminals available can be increased, and signal and power/ground interconnections can be more efficiently routed on the chips.

It should be recognized by those skilled in the art that interconnect substrates of the type disclosed herein may contain additional layers including embedded capacitor layers, conductive layers, dielectric layers, and the like. It is also possible to make interconnect substrates having fewer dielectric and conductive layers depending on the requirements of the final interconnect module.

FIG. 2 is a cross-sectional side view illustration of a multi-layer interconnect substrate 200, having six metal layers. The substrate has a die attach surface 204 and a board attach surface 202. It also includes a central capacitor structure 210 with first and second conductive layers 212, 214 and core layer 211.

Metal films coated with dielectric composite material are laminated to both sides of patterned capacitor structure 210, and subsequently, through vias 240, 242 are drilled and cleaned. Seed metal (not shown) is applied to the via(s) through electroless plating or sputtering or chemical vapor deposition, and then bulk metal is grown through electrolytic plating. Circuitry from the third and fourth conductive layers 232 and 234 is formed by standard techniques. Additional metal films coated with dielectric composite material are then laminated to both sides of the build-up structure. Blind vias 244, 246, 248 are drilled. Seed metal is again applied, followed by bulk metal buildup. Surface circuitries 236, 238 are then formed through standard techniques. Protective coating 262 and 264, are finally applied and patterned to expose top contact pads 252, 254 and bottom electrical contact pads 256.

The core layer 211 of the capacitor structure may be formed by coating a high dielectric material on one or both of first and second conductive layers 212, 214 and then applying heat and pressure to laminate capacitor structure 210 and to cure the dielectric layer. First and second conductive layers 212, 214 can be formed of copper foils, and serve as power and ground planes. Conductive layers 212, 214 may each have a thickness of up to about 40 µm, preferably up to about 18 µm. Core layer 211 may be in the form of an epoxy resin loaded with high dielectric constant particles. The dielectric particles may be selected, for example, from barium titanate (including non-fired barium titanate) barium strontium titanate, titanium oxide, and lead zirconium titanate.

Capacitor structure 210 is extremely thin and exhibits an extremely high dielectric constant. For example, if used in core layer 211, the dielectric composite material is typically formulated such that, upon curing, it has a total dry thickness of less than or equal to approximately 8 microns and, more preferably, from about 1 to about 4 microns. In addition, the dielectric composite material has a high dielectric constant of greater than or equal to approximately 12 and, more preferably, from about 12 to about 150.

In addition, interconnect substrate 200 includes second and third dielectric layers 222, 224 on opposite sides of central capacitor structure 210. Third conductive layer 232 is formed between second dielectric layer 222 and fourth dielectric layer 226. Fourth conductive layer 234 is formed between third dielectric layer 224 and fifth dielectric layer 228. While first and second conductive layers 212, 214 may form power and ground planes, third and fourth conductive layers 232, 234 may be patterned to form signal layers.

Fourth dielectric layer 226 is formed over third conductive layer 232, whereas fifth dielectric layer 228 is formed over fourth conductive layer 234. Conductive layers 236, 238 can be formed on dielectric layers 226 and 228, respectively, and patterned to define preformed apertures for the formation of vias. The preformed apertures are typically formed by laser ablation. Thus, the laser used to form the vias is applied to ablate only the dielectric material.

Conductive layers 232, 234, 236, 238 all may be formed from copper with a thickness in the range of from about 5 to about 14 microns and, more preferably about 12 microns.

Each of dielectric layers 222, 224, 226, 228 may have a thickness in the range of from about 20 to about 70 microns and, more preferably about 36 microns. Thus, the distance between an outer surface of first conductive layer 212 and an inner surface of electrical contact 252 is less than about 100 microns and, more preferably, less than or equal to about 88 microns. The various layers can be laminated together in a single step or through a sequential build-up. For example, prior to lamination, dielectric layers 222, 224 can be coated onto conductive layers 232, 234, respectively. These dielectric/conductive layer pairs can be laminated on either side of the central capacitor structure 210. The conductive layers 232 and 234 can be patterned to define signal traces. Similarly, dielectric layers 226, 228 can be coated onto conductive layers 236, 238, respectively, prior to lamination. These dielectric/conductive layer pairs can be laminated on to the outer surface of conductive layers 232 and 234, respectively. The conductive layers 236, 238 may then be patterned.

In some embodiments, the conductive layers are "balanced", i.e., symmetrically positioned on opposite sides of capacitor structure 210 to promote structural uniformity and resist deformation due to thermal stresses. In particular, conductive layers may be constructed so that each has the same type of metal foil laminated or plated thereon and etched into a pattern across it; the metal concentration in each layer being approximately equal. In this manner, the CTE of one layer and the CTE of the other layer are substantially equal, thereby balancing one another and minimizing warp of the interconnect module under thermal stress.

For I/O interconnection, interconnect substrate 200 includes a number of conductive vias, such as buried through via 240, 242 which extend through dielectric layers 222, 224 and contact conductive layers 232, 234, which in turn, contact blind vias 244, 246, at the die attach surface 204 and blind via 248, at the board attach surface 202, respectively. Typically, blind vias are formed through only one dielectric layer and are used for routing connections between two conductive layers on either side of the dielectric layer. However, blind vias can be formed that extend through a plurality of laminated layers to connect multiple conductive layers on either side of the dielectric layer. Each of the conductive layers can be patterned as required, and any necessary blind vias to connect adjacent conductive layers formed, before the remaining layers are bonded to the overall structure. For power and ground distribution buried through vias 240, 242 may contact either first conductive layer 212 or second conductive layer 214.

Blind vias 244, 246 are placed adjacent to contact pads 252, 254 for receiving solder balls (not shown) from a chip attached to interconnect substrate 200. The solder balls are heated and reflowed to form electrically conductive bonds with contact pads 252, 254 and are electrically connected to vias 244, 246, respectively, thereby interconnecting I/O's on the chip with I/O's on the interconnect substrate 200. Likewise, blind via 248 is adjacent to contact pad 256 to receive solder balls to provide electrical and mechanical connection of the interconnect substrate to the board. The solder balls are heated and reflowed to form conductive bonds with contact pad 256 and therefore are electrically connected to via 248, thereby interconnecting I/O's on the interconnect module with I/O's on the PWB. The blind and buried vias present a low inductance signal path, further reducing impedance in interconnect substrate 200.

EXAMPLES

All percents, ratios and amounts are by weight unless otherwise specified. Laminated articles containing composite dielectric material were made as follows:

Silica surface treatment: 900 g silica ($SiO_2$) particles (SO-E2 available from Tatsumori Ltd., Tokyo, Japan; average particle size: 0.5 μm) were dispersed into 900 g of methyl ethyl ketone (MEK—available from JT Baker, Phillipsburg, N.J.). Then 9 g of vinyl triacetoxysilane (VTAS—available from Aldrich Chemical Co., Milwaukee, Wis.) was added. After stirring at room temperature for about 15 minutes, 20 g of deionized water was added. The dispersion was refluxed under nitrogen for 24 hours. After cooling, about half of the MEK was removed by vacuum distillation with a rotary evaporator. Then about 500 g of toluene (available from EM Science, Gibbstown, N.J.) was added. After removing half of the solvent by rotary evaporation, about 700 g of additional toluene was added. After this solvent exchange, the silica dispersion in toluene [contained small amount (<10%) of MEK] had a solid content of 53%.

Composite Dielectric dispersion formulation: To the above silica dispersion, 727 g of toughened BCB resin (an Experimental CYCLOTENE resin XUR-JW-1148-200201415-47 in Mesitylene, about 53 wt % solid content, available from Dow Chemical Company, Midland, Mich.) was added. After stirring, a composite dielectric dispersion was obtained. Composite dielectric dispersions with varying amounts of treated silica filler content were prepared by adjusting the amount of toughened BCB material added to the silica dispersion.

Priming the Cu foil: Copper foils were treated with fresh 1% vinyltriacetoxysilane (VTAS) solution in 95% ethanol. Alternatively a 1% aminopropylsilane (APS) solution in water (available from Aldrich Chemical Co., Milwaukee, Wis.) may be used. After the copper foils were coated with the silane solution, they were baked for 15 minutes at 140° C. to 150° C. Table 1 summarizes the copper substrates that were evaluated.

TABLE 1

Summary of Copper substrates

| Cu foil type | Cu Foil thickness | Cu surface profile | Cu surface treatment | Vendor | Comments |
|---|---|---|---|---|---|
| 5 μm copper (30 μm Al backing) | 5 μm | Very low[2] | Cr/Zn | Metfoils (Perstorp, Sweeden) | Gray appearance |
| 5 μm copper (30 μm Al backing) | 5 μm | Very low | Cr | Metfoils (Perstorp, Sweden) | Pink reddish appearance |

TABLE 1-continued

Summary of Copper substrates

| Cu foil type | Cu Foil thickness | Cu surface profile | Cu surface treatment | Vendor | Comments |
|---|---|---|---|---|---|
| 3 μm Olin XTF[1] | 3 μm | Very low | Cr/Zn | Olin (Norwalk, CT) | Peelable copper |
| 3 μm Oak Mitsui Microthin[1] | 3 μm | Very low | Cr/Zn | Oak Mitsui (Hoosick Falls, NY) | Peelable copper |
| 18 μm JTC foil | 18 μm | Standard[2] | Cr/Zn with epoxy silane | Gould (Eastlake, OH) | |
| 18 μm Oak Mitsui foil | 18 μm | Standard | Cr/Zn | Oak Mitsui (Hoosick Falls, NY | |
| 18 μm Olin Cu | 18 μm | Very low | Cr/Zn | Olin (Norwalk, CT) | Copper Bond Finish |

[1]With 35 μm Peelable Cu backing.
[2]According to IPC-4562: Metal Foil for Printed Wiring Applications and IPC-CF-148A: Resin Coated Metal Foil for Printed Boards, low profile copper has a maximum foil profile variation ($R_z$) < 5.1 μm; medium profile has 5.1 μm < $R_z$ < 10.2 μm; and standard profile has $R_z$ > 10.2 μm. Most vendor foils follow the IPC standards.

Precision coating: The composite dielectric dispersions were coated onto the primed copper foils using a knurl or extrusion coater and dried at a temperature in the range of about 90° C. to about 150° C. for a period of about 5 to about 20 minutes. The final film thicknesses were controlled from 15 to 38 μm.

Lamination: The coated copper foils were then laminated with VTAS-treated copper foil (such that the composite dielectric material was between the copper foils) at 177° C. for 1 hr, then 235° C. for 2 hrs with a pressure of 800 psi (5.52 MPa). Alternatively two dielectric coated copper films can be laminated together when thicker films are desired.

Peel Adhesion Testing: Peel adhesion testing was done according to a modified version of IPC-TM-650, Test Method Manual, Number 2.4.8, "Peel Strength of Metallic Clad Laminates". After cooling, the laminated copper/dielectric composite/copper laminate were first hand cut to 6.5"×1.25", (about 15 cm×3 cm) then were further trimmed to 6.5"×1" (about 15 cm×2.5 cm) using a JDC precision sample cutter made by Thwing-Albert Instrument Company (Philadelphia, Pa.). The test sample was then pressed onto a 6" diameter aluminum wheel fixture on an INSTRON type tensile tester using a 6.5"×1" (about 15 cm×2.5 cm) 3M SCOTCH brand VHB tape. One end of the test sample was lifted and securely clamped onto the moving crosshead. The peel test was conducted at 2 in/min (about 5 cm/min) fixed travel speed. Peel data was collected at 1 Hz sampling rate and data averaging was typically done over 2.5" (about 6 cm) peel distance.

Properties and Results

Table 2 shows the CTE of the composite dielectric materials (containing treated $SiO_2$ as the inorganic filler) as a function of filler content. Measurements were made after coating the composite dielectric material onto a liner and curing the dielectric material at different temperatures for one hour. Measurements were made on free-standing films of the composite dielectric material. The relationship between filler content in the resin and resulting CTE is almost linear.

TABLE 2

CTE of an $SiO_2$ filled dielectric composite material as a function of $SiO_2$ filler content

| $SiO_2$ Filler Content (wt. %) | CTE (ppm/° C.) | |
|---|---|---|
| | Cured at 250° C. | Cured at 300° C. |
| 0 | 85 | 67 |
| 16 | 79 | 54 |
| 38 | 61 | 42 |
| 60 | 43 | 35 |
| 75 | 28 | 24 |

Table 3 documents the relationship between filler content of an $SiO_2$ dielectric composite material of the current invention and adhesion to copper. Tables 3 and 4 provide specific adhesion data for the $SiO_2$ dielectric composite material as a function of filler loading levels.

Adhesion of materials to thin copper substrates, particularly those substrates with a thickness less than 5 μm, is needed for electronic packages, but can be challenging. In terms of adhesion of treated $SiO_2$ dielectric composite materials to copper foils, each of the copper substrates showed different peel strengths and adhesion failure modes. Generally, incorporation of increasing amounts of filler into the toughened BCB resin has a negative effect on adhesion to copper. The effect of silanes (type, thickness, baking temperature) varied on different copper surfaces. Certain silane primers such as VTAS and APS are efficient in improving copper adhesion to $SiO_2$ dielectric composite material and result in a 'cohesive' failure mode, which is much preferred over an adhesive failure mode.

TABLE 3

Relationship between untreated $SiO_2$ filler content of a composite dielectric material and adhesion to 18 μm JTC Copper (Cr/Zn epoxy silane surface treatment)

| Filler Content in BCB (wt. %) | Cu surfaces | Peel Strength (lbs/in/N/mm) |
|---|---|---|
| 0 | 18 μm JTC foil | 2.8/0.48 |
| 60 | 18 μm JTC foil | 2.3/0.40 |

TABLE 3-continued

Relationship between untreated SiO₂ filler content of a composite dielectric material and adhesion to 18 μm JTC Copper (Cr/Zn epoxy silane surface treatment)

| Filler Content in BCB (wt. %) | Cu surfaces | Peel Strength (lbs/in/N/mm) |
|---|---|---|
| 70 | 18 μm JTC foil | 2.3/0.40 |
| 75 | 18 μm JTC foil | 1.5/0.26 |

TABLE 4

Relationship between treated SiO₂ filler content of a dielectric composite material and adhesion to 5 μm Metfoils (Zinc rich surface treatment) with a 30 μm aluminum backing

| SiO₂ Filler Content (wt. %) | Coated side peel strength (lbs/in/N/mm) | Laminated side peel strength (lbs/in/N/mm) |
|---|---|---|
| 0 | 4.2/0.73 | 4.3/0.75 |
| 60 | 4.0/0.70 | 4.1/0.72 |
| 70 | 3.2/0.56 | 3.9/0.68 |
| 72.5 | 3.0/0.52 | 3.5/0.64 |
| 75 | 2.5/0.44 | 0.8/0.14 |
| 80 | Not determined | 0 |

*If the copper is unprimed and the filler content is about 70%, the peel strength will be about 0.6 lb/in (0.11 N/mm).
"Coated Side" refers to the copper surfaces on which the composite dielectric dispersion was originally coated (and dried).
"Laminated side" refers to the copper surface to which the dried dielectric (on the coated side) is laminated.

Table 5 summarizes key mechanical and electrical properties of the original unmodified BCB resin and the toughened BCB starting resin compared to the properties of the treated SiO₂-filled toughened BCB composite resin system (BCB-SiO₂). These properties include the isotropic CTE, dielectric constant ($D_k$), dielectric loss (loss factor) and the percent elongation to break of the various materials listed. Dielectric constant was measured at 9.3 GHz.

The dielectric measurements were made on free-standing dielectric films using a known split-post dielectric and magnetic resonator technique. The thin material or film to be tested was inserted between two fixed dielectric resonators. The resonator measured the permittivity component in the plane of the specimen. The split-post resonator is used to make dielectric measurements in the low gigahertz region from about 1.1 GHz to about 35 GHz.

To have a higher elongation (greater than 2%) for the dielectric composite material, it is useful for the original resin to have elongation higher than about 25%.

TABLE 5

Comparison of material properties of components of a dielectric composite material

| Material | CTE (ppm/° C.) | $D_k$ | Loss factor | Elongation |
|---|---|---|---|---|
| Original BCB | 52 | 2.50 | 0.0018 | 7% |
| Toughened BCB (15% toughening agent) | 85 | 2.40 | 0.0018 | 25% |
| SiO₂ | 0.5 | 4.0 | <0.001 | — |
| BCB-SiO₂ (70% filler) | 32 | 3.0 | 0.002 | 2.5% |

It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. An electronic package comprising a non-conductive core layer of dielectric composite material and at least one conductive layer laminated thereto, wherein said dielectric composite material has a dielectric constant less than about 3.5, and a dielectric loss of less than about 0.004, wherein the dielectric composite material includes a toughened benzocyclobutene resin, and from about 50% to about 75% by weight of at least one inorganic particulate filler, said resin and said inorganic particulate filler being compatibilized by means of a silane coupling agent.

2. An electronic package according to claim 1 wherein said conductive layer has a thickness of less than about 40 μm.

3. An electronic package according to claim 2 wherein said conductive layer is low profile copper having a thickness of up to about 5 μm.

4. An electronic package according to claim 1 wherein said at least one inorganic particulate filler is a particulate silica having an average particle size less than or equal to ten percent of the thickness of a layer of the dielectric composite material.

5. An electronic package according to claim 1 wherein said package comprises a core layer.

6. An electronic package according to claim 5 wherein said core layer comprises a polymer selected from the group consisting of liquid crystal polymers, and polyimide polymers.

7. An electronic package according to claim 5 wherein pairs of at least one conductive layer and at least one dielectric layer are disposed symmetrically about the non-conductive core layer.

* * * * *